(12) United States Patent
Mitsuhashi et al.

(10) Patent No.: US 7,982,272 B2
(45) Date of Patent: Jul. 19, 2011

(54) THIN-FILM SEMICONDUCTOR DEVICE AND METHOD FOR MANUFACTURING THE SAME

(75) Inventors: Katsunori Mitsuhashi, Yokohama (JP); Tetsuya Ide, Yokohama (JP)

(73) Assignee: Advanced LCD Technologies Development Center Co., Ltd., Kawasaki-shi (JP)

( * ) Notice: Subject to any disclaimer, the term of this patent is extended or adjusted under 35 U.S.C. 154(b) by 0 days.

(21) Appl. No.: 12/405,680

(22) Filed: Mar. 17, 2009

(65) Prior Publication Data

US 2009/0242891 A1 Oct. 1, 2009

(30) Foreign Application Priority Data

Mar. 26, 2008 (JP) .................................. 2008-081044

(51) Int. Cl.
 *H01L 21/02* (2006.01)
(52) U.S. Cl. ......... 257/384; 257/E29.151; 257/E51.005; 257/382; 257/383
(58) Field of Classification Search .................. 257/382, 257/383, 384, E29.151, E51.005
See application file for complete search history.

(56) References Cited

U.S. PATENT DOCUMENTS

| | | | | |
|---|---|---|---|---|
| 6,600,212 | B2 * | 7/2003 | Takayanagi et al. | 257/616 |
| 7,223,666 | B2 * | 5/2007 | Ohtani et al. | 438/344 |
| 7,247,562 | B2 * | 7/2007 | Ishikawa | 438/666 |
| 7,598,615 | B2 * | 10/2009 | Lee et al. | 257/758 |
| 7,602,020 | B2 * | 10/2009 | Takemura et al. | 257/347 |
| 2003/0206035 | A1 * | 11/2003 | Hu | 324/765 |
| 2006/0270073 | A1 * | 11/2006 | Isobe | 438/17 |
| 2007/0210334 | A1 * | 9/2007 | Lim et al. | 257/200 |
| 2007/0210451 | A1 * | 9/2007 | Ohtani et al. | 257/734 |
| 2007/0232005 | A1 * | 10/2007 | Maruyama et al. | 438/299 |
| 2007/0295976 | A1 * | 12/2007 | Katou | 257/93 |
| 2009/0152631 | A1 * | 6/2009 | Takemura et al. | 257/347 |
| 2009/0203177 | A1 * | 8/2009 | Mitsuhashi | 438/166 |
| 2009/0250758 | A1 * | 10/2009 | Isobe | 257/350 |

FOREIGN PATENT DOCUMENTS

| | | |
|---|---|---|
| JP | 7-122737 | 5/1995 |
| JP | 9-172064 | 6/1997 |
| JP | 9-293865 | 11/1997 |
| JP | 2000-58680 | 2/2000 |
| JP | 2005-5508 | 1/2005 |
| JP | 2005-101064 | 4/2005 |
| JP | 2007-35823 | 2/2007 |
| JP | 2007-184456 | 7/2007 |

OTHER PUBLICATIONS

P. G. Le Comber, et al., "Amorphous-Silicon Field-Effect Device and Possible Application", Electronics Letters, vol. 15, No. 6, Mar. 15, 1979, pp. 179-181.

* cited by examiner

*Primary Examiner* — Jarrett J Stark
(74) *Attorney, Agent, or Firm* — Oblon, Spivak, McClelland, Maier & Neustadt, L.L.P.

(57) ABSTRACT

A thin-film semiconductor device including a transparent insulating substrate, an island semiconductor layer formed on the transparent insulating substrate and including a source region containing a first-conductivity-type impurity and a drain region containing a first-conductivity-type impurity and spaced apart from the source region, a gate insulating film and a gate electrode which are formed on a portion of the island semiconductor layer, which is located between the source region and the drain region, a sidewall spacer having a 3-ply structure including a first oxide film, a nitride film and a second oxide film, which are respectively formed on a sidewall of the gate electrode, and an interlayer insulating film covering the island semiconductor layer and the gate electrode.

5 Claims, 13 Drawing Sheets

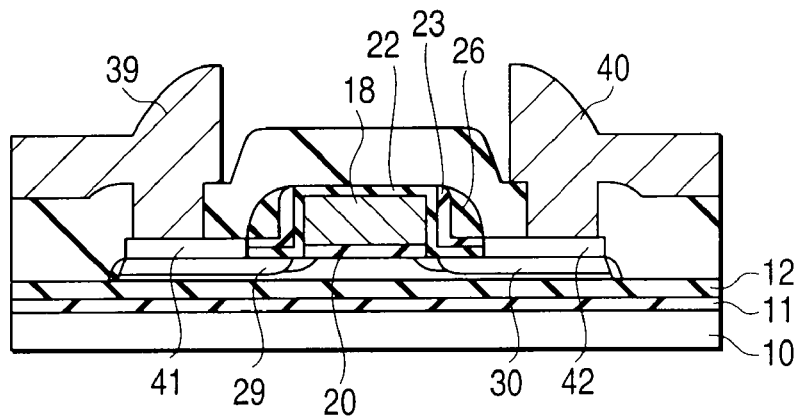
F I G. 3
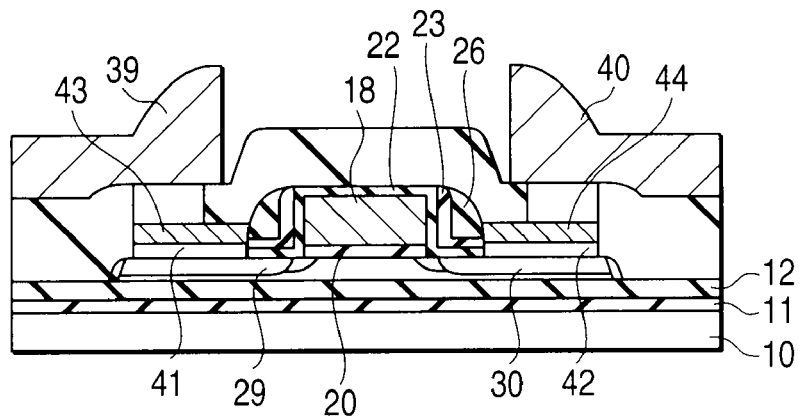
F I G. 4
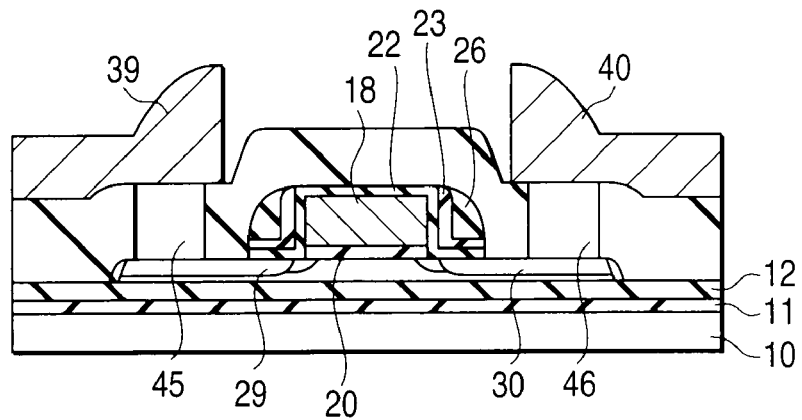
F I G. 5

THIN-FILM SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2008-081044, filed Mar. 26, 2008, the entire contents of which are incorporated herein by reference.

BACKGROUND OF THE INVENTION

1. Field of the Invention

This invention relates to a thin-film semiconductor device which is applicable, for example, to an active matrix flat panel display and to a method for manufacturing the thin-film semiconductor device.

2. Description of the Related Art

The technique for semiconductor thin films is an important technology for forming semiconductor elements such as a thin-film transistor (TFT), a contact sensor, a photoelectric conversion device, etc. The thin-film transistor is a field-effect transistor of MOS (MIS) structure and is applied to a flat panel display such as a liquid crystal display device (for example, P. G. LeComber, W. E. Spear and A. Ghaith, "Amorphous-Silicon Field-Effect Device and Possible Application", Electronics Letter, Vol. 15, No. 6, pp. 179-181, March 1979).

A liquid crystal display device is characterized in that it is generally thin in thickness, light in weight and low in power consumption, and that it is easy in displaying colors. In view of these characteristics, the liquid crystal display device is widely used as a personal computer or as a display for various kinds of mobile information terminals. When the liquid crystal display device is of active matrix type, the thin-film transistor is installed therein as a pixel switching element.

The active layer (carrier mobile layer) of the thin-film transistor is formed of a silicon semiconductor thin film for example. This silicon semiconductor thin film can be classified into amorphous silicon (a-Si) and polycrystalline silicon (non-monocrystalline silicon) having crystal phases. Although the polycrystalline silicon is mainly constituted by polycrystal silicon (Poly-Si), but microcrystal silicon (μc-Si) is also included in the definition of polycrystalline silicon. The materials for the semiconductor thin film include, other than silicon, for example SiGe, SiO, CdSe, Te, CdS, etc.

The carrier mobility of polycrystalline silicon is about 10-100 times as large as the carrier mobility of amorphous silicon. From this characteristic of polycrystalline silicon, it is evident that the polycrystalline silicon is very excellent for use as a semiconductor thin-film material for a switching element. In recent years, because of high-speed in operation, the thin-film transistor wherein polycrystalline silicon is used as an active layer has been noticed as a switching element which is capable of constituting various kinds of logic circuits such, for example, as a domino circuit and CMOS transmission gate. These logic circuits are needed for constituting the driving circuit of a liquid crystal display device or of an electroluminescence display device, a multiplexer, EPROM, EEPROM, CCD, RAM, etc.

Herein, the conventional representative process for forming a semiconductor thin film of polycrystalline silicon will be explained. In this process, an insulating substrate such as a glass substrate is prepared at first and then a silicon oxide film ($SiO_2$) for example is formed as an undercoat layer (or a buffer layer) on the insulating substrate. Further, an amorphous silicon (a-Si) film is formed to a thickness of about 50-100 nm as a semiconductor thin film on this undercoat layer. Thereafter, the amorphous silicon film is subjected to dehydrogenation treatment for decreasing the hydrogen concentration in the amorphous silicon film. Then, by means of excimer laser crystallization method, etc., the fusion/recrystallization of the amorphous silicon film is performed. More specifically, excimer laser is irradiated to the amorphous silicon film, thereby converting the amorphous silicon into polycrystalline silicon.

In this manner, the thin-film transistor layer formed on a glass substrate is subjected to a fine working technique, a thin-film-forming technique, an impurity doping technique, a washing technique, a heat treatment technique, etc. which are now employed in the field of IC (LSI). These steps are repeated to create a desired device/circuit.

At present, a semiconductor thin film of polycrystalline silicon as described above is employed as an active layer of an n-channel or p-channel thin-film transistor. In this case, the field effect mobility (the mobility of electrons or holes by the electric field effect) of the thin-film transistor becomes about 100-150 $cm^2$/Vsec in the case of the n-channel thin-film transistor and about 100 $cm^2$/Vsec in the case of the p-channel thin-film transistor. By making use of the thin-film transistor as described above, driving circuits such as a signal line driving circuit and a scanning line driving circuit can be formed, together with a pixel switching element, on the same substrate, thus obtaining a driving circuit-integrated display device and thereby making it possible to reduce the manufacturing cost of the display device.

As described above, by promoting the refineness of the thin-film semiconductor device, it has been made possible to enhance the performance of device/circuit as well as the reliability of the system. However, there are many factors that deteriorate the reliability of thin-film semiconductor device in itself. These factors include a phenomenon called "hot carrier phenomenon" originating from the physical properties of device in addition to factors originating from the materials employed therein (such as disconnection due to the fatigue or corrosion of metal wirings, dielectric breakdown, the variation in characteristics of device due to contamination [by Na, etc.], etc.).

Namely, the electron that has been accelerated by the electric field in a channel is caused to impinge against the lattice of Si as the energy band of the electron is increased beyond the energy of band gap (1.1 eV), thereby generating an electron-hole pair (impact ionization). On this occasion, the electron is attracted by the gate voltage $V_G$ and enabled to jump into the gate oxide film even if the electron is not necessarily provided a high energy exceeding the potential barrier (about 3.1 eV) of Si—$SiO_2$. Some of this electron is captured in this oxide film and permitted to remain therein as an electric charge. This not only causes the Vth of a transistor to shift toward the normal direction but also cause the mutual conductance gm to decrease. When the electric field inside the element is high, the electron existed in the channel is enabled to directly jump into the gate oxide film. The problem related to the reliabilities as described above is called "hot-carrier effect", giving an important factor which obstructs the refining of the device.

This hot-carrier effect is caused by a high electric field. Accordingly, it is generally recognized that a method of providing an n-type (p-type) region of low dope concentration in the vicinity of the drain exhibiting a highest electric field to thereby alleviate the electric field is effective in suppressing the hot-carrier effect. A device which has been figured out to cope with this problem is a structure called "lightly doped drain (LDD)", which is also effective in the p-type region.

This LDD is generally created as follows. First of all, by making use of a gate electrode as a mask, an n-type impurity ion and a p-type impurity ion are respectively implanted under a low doping condition {n⁻-(p⁻-layer)}. Subsequently, an $SiO_2$ film is deposited all over the surface and then the entire surface of the $SiO_2$ film is uniformly etched by means of oriented dry etching, thereby leaving a sidewall spacer consisting of the $SiO_2$ film on the sidewall of gate. By making use of this spacer as a mask, the implantation of ion is performed under the condition where the doping concentration is made higher, thereby forming n⁺-layer (p⁺-layer). Since the impact ionization phenomenon depends strongly on the intensity of electric field, it is possible to improve the voltage resistance even if the alleviation in intensity of electric field is only 10%.

However, in the $SiO_2$ etch-back process for forming the aforementioned LDD sidewall spacer, it is required to employ fine working techniques enabling very high uniformity. Although it is generally conceivable to employ a sidewall spacer having a width of about 200 nm in the Si-MOSFET of submicron rule, it is required, in order to form such a sidewall spacer, to form a sacrificial oxide film for forming a sidewall spacer having a width of about 500 nm. When the uniformity of etching is assumed to be ±10% for example, variability in thickness of ±50 nm may be caused to be transcribed to an underlying film. In the case of a gate oxide film having a 50-nm-thick underlying film, while the residual film thickness of the region where the etching rate distribution is the highest would become zero, the residual film thickness of the region where the etching rate distribution is the lowest would become 100 nm. Since it is generally conceivable that the gate oxide film deposited on the source/drain regions may be used as a through oxide film for the impurity doping to be subsequently performed, the variability of etching is required to be suppressed to at most ±10% or so to control the doping profile. When the underlying gate oxide film is set to 50 nm in thickness, the residual film thickness should be controlled so as to have a thickness of about 45-55 nm. Namely, unless the aforementioned etching variability of ±10% is reduced to ±1% in the aforementioned $SiO_2$ etch-back process, it would be impossible to satisfactorily cope with the aforementioned requirement. It is no exaggeration to say that this reduced value can never be achieved by making use of the dry etching apparatuses which are now available in the market. As for alternative measures for solving this problem, it is conceivable to take some measures so as to prevent the variability of etching from being transcribed to the underlying film or to insert a buffering film which is capable of absorbing the variability of etching in the $SiO_2$ etch-back process for forming the aforementioned sidewall spacer. In the case of the LSI device which is a predecessor of the refined device, the etch-back is performed in such a manner that the residual film of the underlying gate insulating film becomes zero, enabling the underlying Si active layer to expose and using the Si layer of the underlying Si substrate or of SOI substrate as a buffering layer. In this case however, it would become unavoidable to invite the dry etching damage in the etch-back process. If it is desired to recover from this damage, it is generally recognized to execute a heat treatment of around 1000° C. In the case of the LSI device, the recovery from this damage is assumed to be executed in a subsequent heat treatment step which is performed at a temperature of around 1000° C. In the case of TFT where glass is used as a substrate material however, it is difficult to employ a heat treatment of such a high temperature as described above. As far as the surface of glass substrate is concerned, the treatment temperature thereof is required to be confined to not higher than 600° C. in viewpoint of the heat resistance of the glass substrate. Therefore, it is now desired to develop an alternative technique which makes it possible to utilize even a low-temperature process.

The formation of the aforementioned sidewall spacer is now considered indispensable even in a future manufacturing process of a refined TFT where a high-melting-point metal silicide can be formed in a self-aligned manner in source/drain regions. Therefore, it is now considered indispensable to develop an etching control method which is needed for the formation of the sidewall and also to develop an etching control structure.

There are persistent expectations for the development of a method of forming a sidewall spacer which is indispensable in the creation of an LDD structure transistor or in the creation of a self-aligned silicide source/drain transistor, wherein the method can be carried out without giving any adverse influence to the device in terms of the working accuracy, in terms of stability enabling to carry out even in mass production and in terms of dry etching damage.

Since any method which requires a long time for the treatment cannot be a practical solution and since it is becoming increasingly difficult to adopt the batch treatment of substrates (a system to reduce the treatment time per sheet by performing the treatment of a plurality of sheets at the same time) due to the employment of a large size substrate, it is now desired, in view of the recent trend to adopt a sheet-to-sheet treatment, to figure out a solution enabling a low cost process in terms of manufacturing tact and apparatus cost.

First of all, the above problem was tackled in viewpoint of improving the uniformity of dry etching. As a result, it was found possible to expect the achievement of ±2% or so in uniformity of dry etching. However, it was found difficult to achieve the aforementioned level of ±1% or so in terms of the uniformity of dry etching. Even if it is possible to achieve such a low level in terms of the uniformity of dry etching, it cannot be constantly achieve such a low level in the process of mass production, thus rendering it as not a practical solution. Further, with respect to the method of utilizing the underlying Si layer as an etching stopper layer, it is no exaggeration to say that it is almost impossible to completely avoid the generation of damage in the dry etching process, so that to solve the problem, it is conceivably required to employ a method for recovering from the generated damage or to employ a method for removing a damaged layer. With regard to the former method, a heat treatment may be required for recovering from the damage and with regard to the latter method, it may be required to develop a device structure which is capable of removing the damaged layer. However, in the former method, it will be generally required to employ a temperature of as high as 1000° C. or so to achieve the recovery from the damage as described above, thus rendering the method conceivably unpractical in view of the heat resistance of the glass substrate. Even in the latter method, there is a problem that although the depth of damage is required to be confined to such a level that is allowable relative to the fluctuations of film thickness of the Si active layer, it has been already made clear that the thickness of the damaged layer is almost the same with or larger than the thickness of the Si active layer presently employed. In view of these facts, neither of methods is now found useful as a practical solution.

BRIEF SUMMARY OF THE INVENTION

An object of the present invention is to provide a thin-film semiconductor device which is provided with excellent properties wherein the variability of film thickness can be suppressed and the generation of dry etching damage can be also suppressed.

Another object of the present invention is to provide a method of manufacturing a thin-film semiconductor device exhibiting such excellent properties.

According to a first aspect of the present invention, there is provided a thin-film semiconductor device comprising: a transparent insulating substrate; an island semiconductor layer formed on the transparent insulating substrate and including a source region containing a first-conductivity-type impurity and a drain region containing a first-conductivity-type impurity and spaced apart from the source region; a gate insulating film and a gate electrode which are formed on a portion of the island semiconductor layer, which is located between the source region and the drain region; a sidewall spacer having a 3-ply structure including a first oxide film, a nitride film and a second oxide film, which are respectively formed on a sidewall of the gate electrode; and an interlayer insulating film covering the island semiconductor layer and the gate electrode.

According to a second aspect of the present invention, there is provided a method of manufacturing a thin-film semiconductor device, which comprises forming an amorphous semiconductor layer on a transparent insulating substrate; forming a crystallized region in the amorphous semiconductor layer; forming a gate insulating film and a gate electrode on the crystallized region; implanting a first impurity into an expected source region and an expected drain region, which are located in the crystallized regions respectively neighboring to the opposite sides of the gate electrode, the implanting being performed using the gate electrode as a mask; successively forming a first oxide film functioning as an etching stopper, a nitride film functioning as an etching stopper and a second oxide film functioning as a sidewall spacer to thereby form a 3-ply layer on the surface of resultant structure; subjecting the 3-ply layer to etching-back to thereby form a sidewall spacer having a 3-ply structure on the sidewall of the gate electrode; removing an exposed portion of the etching stopper nitride film by making use of the gate electrode and the sidewall spacer as a mask; and forming a source region and a drain region by implanting a second impurity into these source and drain regions with the first oxide film being used as a through oxide film for implanting the second impurity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a cross-sectional view of a polycrystalline silicon thin-film transistor according to Example 3;

FIG. 4 is a cross-sectional view of a polycrystalline silicon thin-film transistor according to Example 4;

FIG. 5 is a cross-sectional view of a polycrystalline silicon thin-film transistor according to Example 5;

DETAILED DESCRIPTION OF THE INVENTION

There will now be described the polycrystalline silicon thin-film transistor (TFT) according to one embodiment of the present invention and the manufacturing process thereof with reference to the accompanying drawings. This polycrystalline silicon thin-film transistor (TFT) can be employed for constituting a pixel switching array, a driving circuit or a digital-to-analog converter of a display device such as an active matrix liquid crystal display device.

The polycrystalline silicon thin-film transistor (TFT) according to one embodiment of the present invention includes a 3-ply sidewall structure formed on the sidewall of the gate electrode. The formation of this 3-ply sidewall structure can be performed by a successive etching of a 3-ply laminate constituted by a first oxide film functioning as an etching stopper, a nitride film functioning as an etching stopper and a second oxide film functioning as a sidewall spacer, all of which have been formed by making use of a low-temperature film-forming method, i.e. a film-forming method to be performed such as plasma CVD method. Due to this characteristics, it is now possible to avoid the damage of dry etching and to create a TFT having a refined sidewall structure and exhibiting a uniformity of ±10% or so in thickness, which can be sufficiently achieved even in the conventional level of mass production process. Namely, it is now possible, through the application of this technique, to manufacture, with high accuracy, a thin-film semiconductor device exhibiting excellent device characteristics as explained below.

Followings are explanations of various examples of the present invention.

Example 1

Figure 1A:
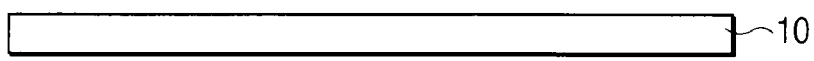
FIGS. 1A-1Z are cross-sectional views each illustrating the manufacturing steps of a polycrystalline silicon thin-film transistor according to Example 1.
Figure 1B:
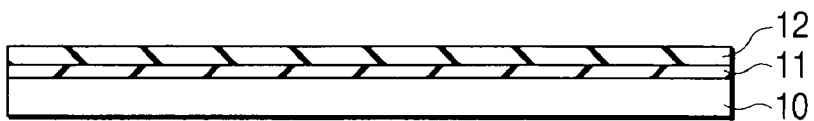
Figure 1C:
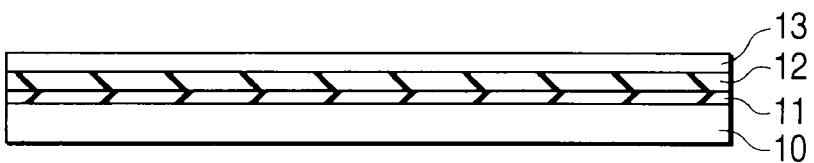
Figure 1D:
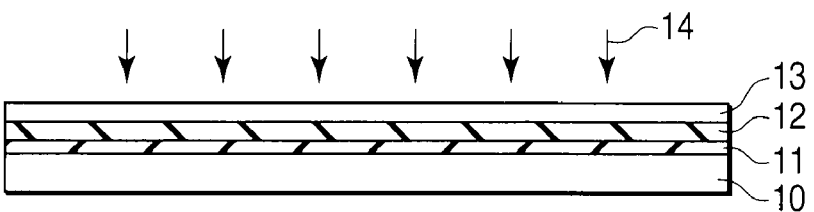
Figure 1E:
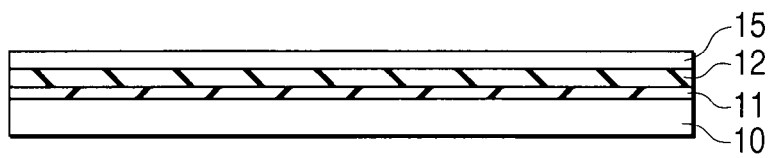
Figure 1F:
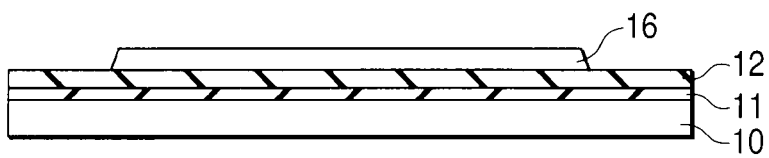
Figure 1G:
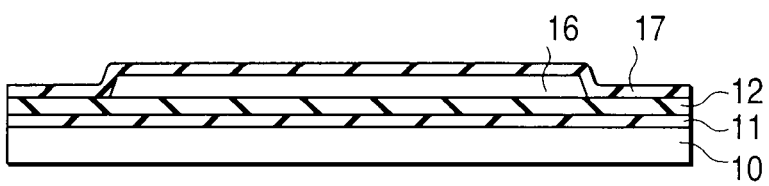
Figure 1H:
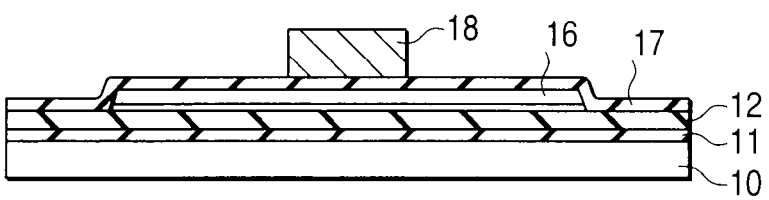
Figure 1I:
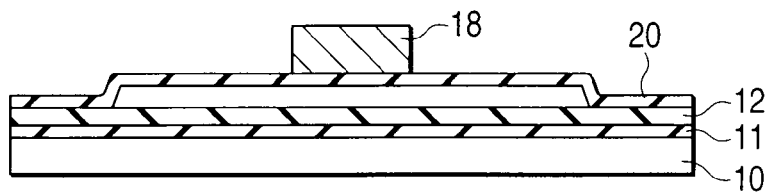
Figure 1J:
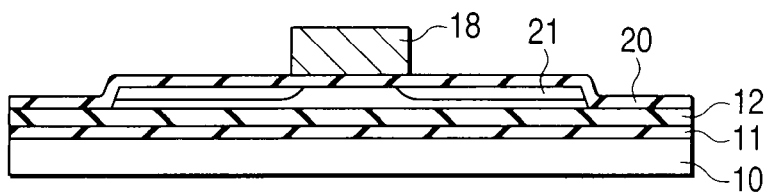
Figure 1K:
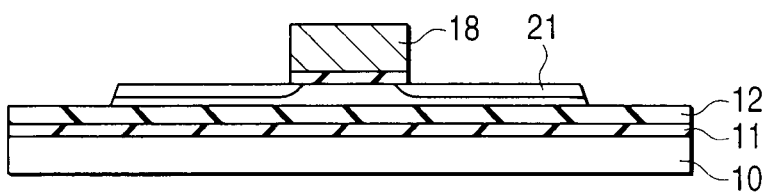
Figure 1L:
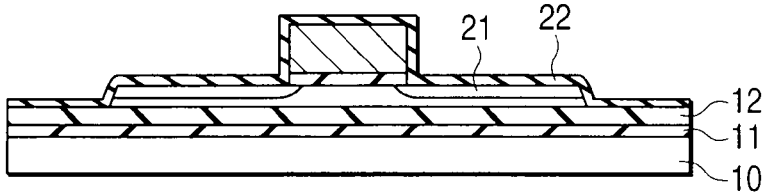
Figure 1M:
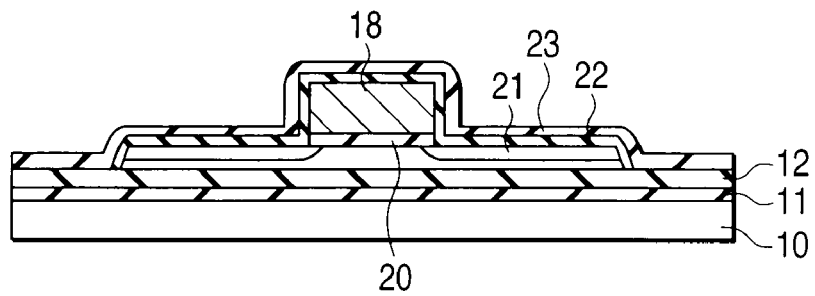
Figure 1N:
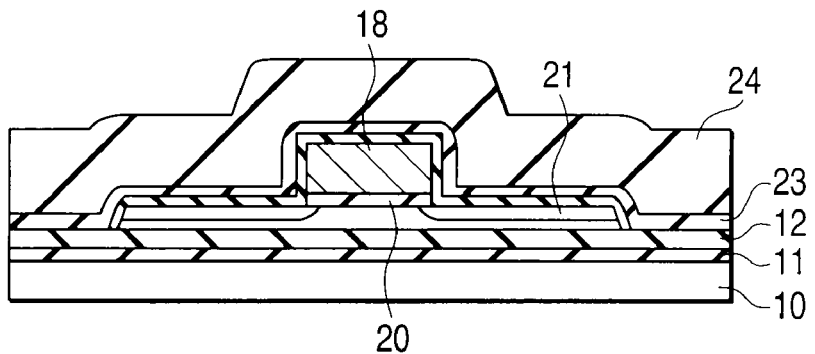
Figure 1O:
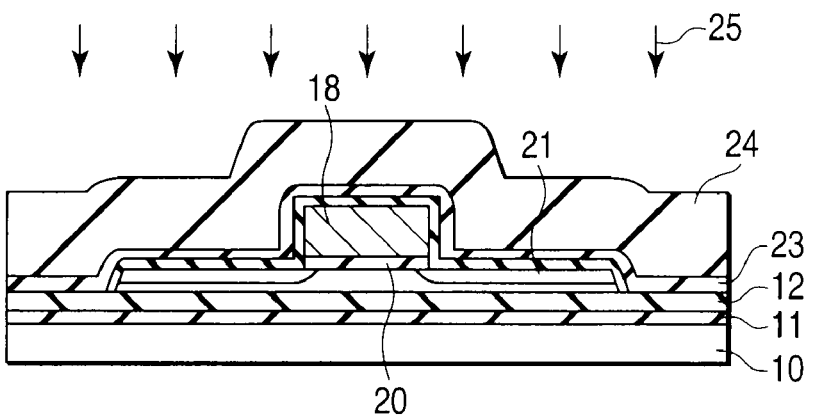
Figure 1P:
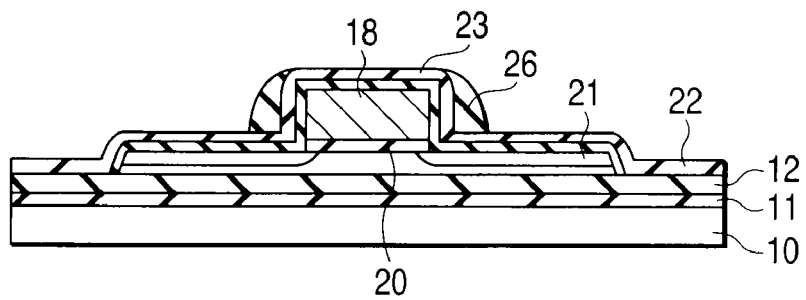
Figure 1Q:
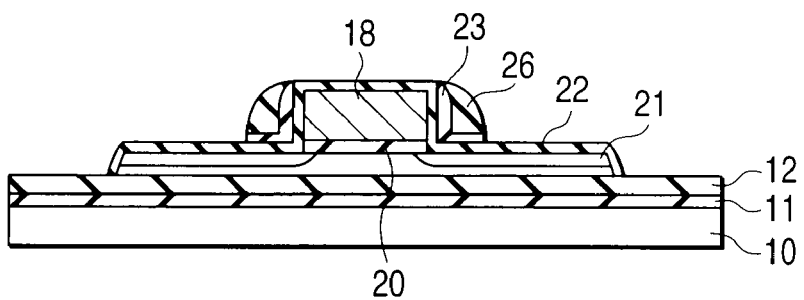
Figure 1R:
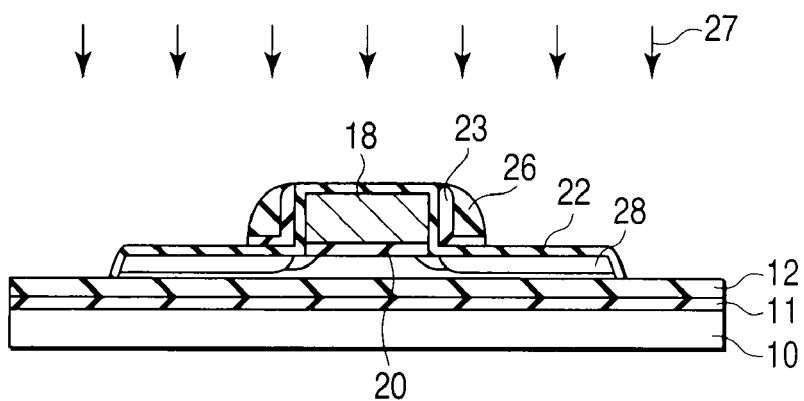
Figure 1S:
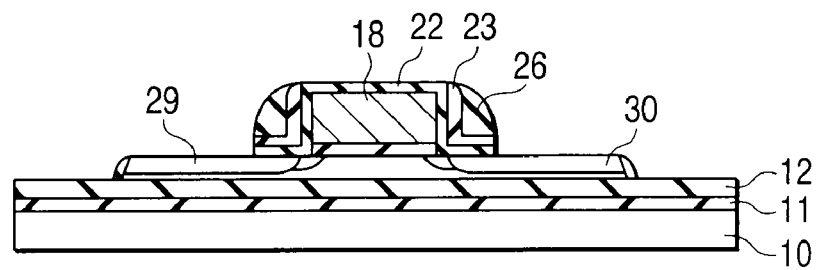
Figure 1T:
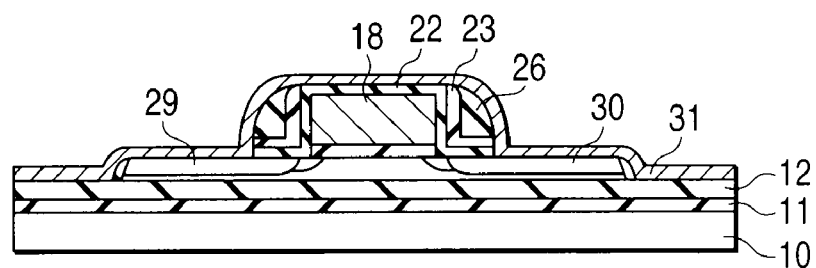
Figure 1U:
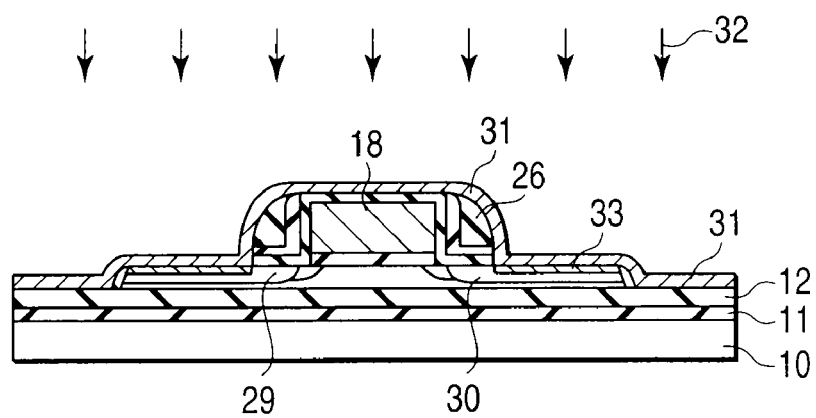
Figure 1V:
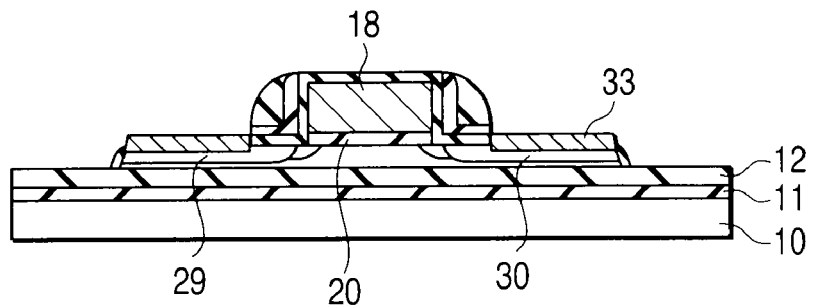
Figure 1W:
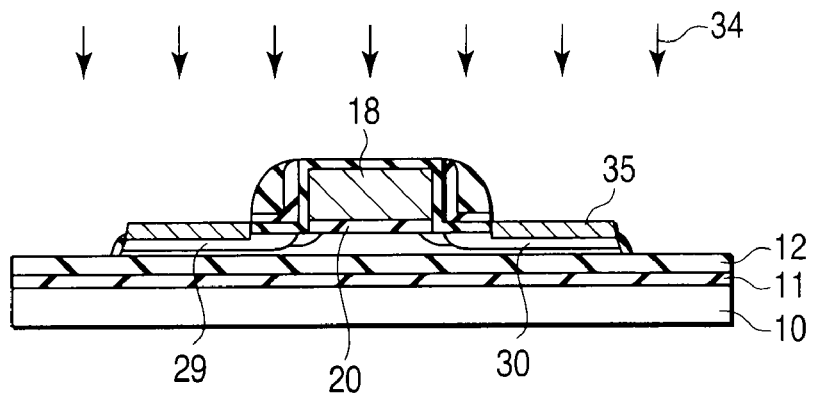
Figure 1X:
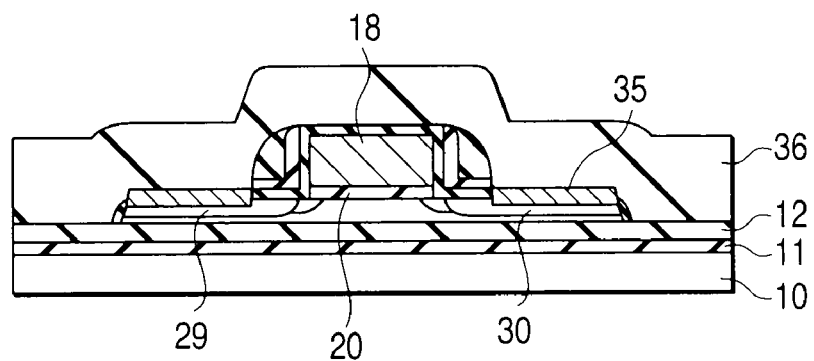
Figure 1Y:
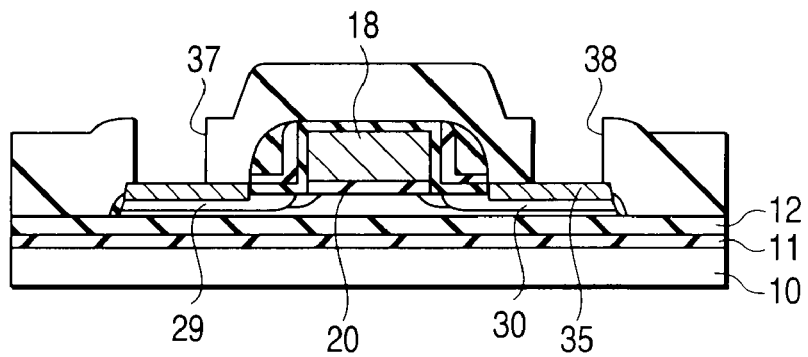
Figure 1Z:
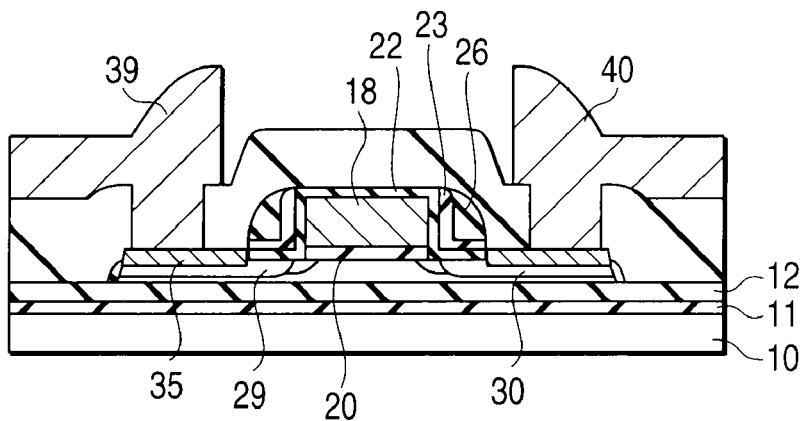

FIGS. 1A-1Z are schematic cross-sectional views of the element portions of TFT for illustrating a sequence of the manufacturing steps of a polycrystalline silicon TFT according to this example.

As shown in FIG. 1A, a transparent insulating substrate 10 which is made of quartz or alkali-free glass commonly employed for a flat panel display is prepared. There are strict requirements as for the properties of the substrate 10 such as surface roughness, surface flaw, the warpage of substrate, thermal shrinkage, heat resistance, chemical resistance, etc. in addition to surface roughness and surface flaw, though they differ depending on the specific system of display.

Then, as shown in FIG. 1B, undercoat layers 11 and 12 are formed on the surface of the transparent insulating substrate 10. These undercoat layers 11 and 12 are formed of a nitride film-based insulating film having a thickness of 50 nm and a silicon oxide film ($SiO_2$) having a thickness of 100 nm, respectively, each of which can be deposited on the transparent insulating substrate 10 by means of plasma CVD method for example.

Then, as shown in FIG. 1C, an amorphous semiconductor thin film 13 is formed on these undercoat layers 11 and 12. This amorphous semiconductor thin film 13 is formed of an amorphous silicon film (a-Si) having a thickness of, for example, 100 nm, which can be deposited on the silicon oxide film of the undercoat layer 12 by means of LP-CVD (Low Pressure CVD) method for example. The LP-CVD may be carried out under the conditions of: a $Si_2H_6$ atmosphere, 150 sccm in flow rate, 8 Pa in pressure, 450° C. in substrate temperature and 35 minutes in deposition time for example. Although the LP-CVD method is employed in this example, it is also possible to employ PE-CVD (low-temperature plasma CVD) method for example.

Subsequently, depending on the film conditions of the amorphous semiconductor thin film 13 thus formed, this thin film 13 may be subjected to a dehydrogenation treatment for eliminating the hydrogen contained in the film. Further, a light-transmitting insulating film (not shown) may be deposited, in some cases, as a sacrificial film for crystallization on the amorphous semiconductor thin film 13. This light-transmitting insulating film is permeable to an incident beam and is formed of a silicon oxide film having a thickness of 10 nm which can be deposited by means of LP-CVD method for example. This light-transmitting insulating film may be omitted in a case where a laser annealing method is employed.

Then, as shown in FIG. 1D, to crystallize the amorphous silicon, the amorphous semiconductor thin film 13 is subjected to a laser annealing treatment 14 using, as an energy beam, XeCl excimer laser or KrF excimer laser for example. Namely, the KrF excimer laser is irradiated, through a light-transmitting insulating film (not shown), to the amorphous semiconductor thin film 13, thereby heating the amorphous semiconductor thin film 13. The energy density of the KrF excimer laser may be about 350 mJ/cm$^2$. In the amorphous semiconductor thin film 13 which has been brought into a heated condition, the amorphous silicon is crystallized as polycrystalline silicon.

The step shown in FIG. 1E illustrates a state wherein the light-transmitting insulating film (not shown) that has been subjected to the laser annealing treatment is removed by making use of a solution such as dilute hydrofluoric acid or buffered hydrofluoric acid, thereby exposing a crystallized semiconductor thin film 15 as polycrystalline silicon.

Then, a resist material is coated on the crystallized semiconductor thin film 15 and selectively irradiated by making use of a photomask. Subsequently, the resist material is selectively removed leaving only the masked region for forming a polycrystalline silicon TFT, thereby creating a resist pattern (not shown). Thereafter, the patterning of the crystallized semiconductor thin film 15 is performed by way of dry etching treatment using the resist pattern (not shown) as a mask.

In this dry etching treatment, $CF_4$ and $O_2$ for example may be employed as an etching gas for the crystallized semiconductor thin film 15. After this dry etching, the resist pattern (not shown) is removed from this semiconductor thin film 15 by way of a dipping treatment using an organic stripping solution, thus obtaining a semiconductor pattern 16 as shown in FIG. 1F.

Subsequently, as shown in FIG. 1G, a gate insulating film 17 is deposited all over the surface of substrate including the semiconductor pattern 16. This gate insulating film 17 is formed of a silicon oxide film having a thickness of 30 nm which is deposited on the semiconductor pattern 16 by means of a plasma CVD method for example. This plasma CVD may be performed using, as a reaction gas, tetraethyl orthosilicate: $Si(OC_2H_5)_4$ {which may be abbreviated as TEOS (tetraethoxy silane)} and under the condition of 350° C. in substrate temperature.

Thereafter, an impurity of very low concentrations may be implanted into the regions of the semiconductor pattern 16 which are designed to be turned into an n-type MOS and a p-type MOS. To control the threshold value of the n-type MOS, p-type impurity doping is performed. This is performed for the purpose of precisely controlling the threshold voltage Vth of not only the n-type TFT but also the p-type TFT, since the logic circuit such as CMOS inverter for instance is constituted by a combination of an n-channel polycrystalline silicon TFT and a p-channel polycrystalline silicon TFT. For the purpose of precisely controlling the threshold voltage Vth for forming the n-type TFT, the doping is carried out under the conditions of: $^{49}BF_2^+$, 50 keV and $5\times10^{12}/cm^{-2}$. In this case, the region of the p-type MOS transistor may be also doped with the impurity. However, the employment of masking by making use of a resist dare not to be done for the purpose of simplifying the process (the number of masks can be reduced). Instead, this problem may be coped with by the adjustment of doping quantity to be performed in the next step for controlling the threshold value of the p-type MOS transistor. Although the adjustment of doping quantity of the n-type MOS transistor is performed by way of ion implantation in this step, it is also studied to perform the adjustment of doping quantity by the addition of boron on forming an amorphous silicone film for forming a semiconductor film.

Then, a photomask (not shown) for the doping of an n-type impurity for controlling the threshold value of the p-type MOS transistor is formed and then the doping of an n-type impurity is performed. The doping conditions on this occasion are: $^{31}P^+$, 50 keV and $5\times10^{12}/cm^{-2}$. With respect to the impurity implantation step for controlling these threshold voltages, the n-type impurity implantation step and/or the p-type impurity implantation step may be sometimes omitted in view of the fluctuation of the threshold voltage Vth that may be caused by the stationary electric charge within the film or the interfacial level thereof, or in view of the target performance of device or of the circumstances of related processes, or in view of the simplification of process. As a result of the aforementioned steps, the impurity doping of desired concentrations in the regions for creating the n-type MOS and the p-type MOS is accomplished and hence the photoresist (not shown) is removed by way of dipping treatment using an organic stripping solution. Subsequently, the heat treatment for activating the ions implanted in the Si is required. However, this activating heat treatment is generally carried out collectively in a subsequent step of heat treatment.

Then, as shown in FIG. 1H, an electrode layer is formed on the gate insulating film 17. This electrode layer is formed of a high-melting-point metal layer MoW having a thickness of 200 nm, which can be deposited on the silicon oxide film of the gate insulating film 17 by means of sputtering for instance. Specifically, the deposition of this film can be performed by means of DC sputtering under the conditions of: 100° C. in substrate temperature, 4 mTorr in Ar pressure, 2 kW in supply power and 60 seconds in discharging time.

Subsequently, a resist material is coated on the electrode layer and selectively irradiated by making use of a photomask. Thereafter, the resist material is selectively removed leaving ones located in the gate electrode-forming mask region, thereby forming a resist pattern (not shown). Then, by way of dry etching treatment using the resist pattern (not shown) as a mask, the patterning of the electrode layer is performed to form a gate electrode 18. In this dry etching treatment, $Cl_2$ and $O_2$ are employed as an etching gas for instance and the fine working is performed by making use of a high-density plasma etching under the conditions of: 25 mTorr in pressure, 1 kW in microwave power, and 25 W in high-frequency power for lower electrodes. Subsequently, the resist pattern (not shown) is removed by a process comprising a 20-minutes ashing treatment using $O_2$ plasma on the gate electrode 18 and a dipping treatment using an organic stripping solution.

In the step shown in FIG. 1I, the Si ion implantation (or doping) for both of the n-type MOS and the p-type MOS is collectively performed to the semiconductor layer 16 through a through oxide film (residual film left after the etching of the gate oxide film) 20. This Si ion implantation step is performed for the purpose of solving the problems that crystal defects may be caused on a subsequent impurity implantation (n- and p-impurity implantation) at low concentration as well as on a subsequent impurity implantation ($n^+$ and $p^+$ impurity implantation) at high concentration for forming the n-type MOS and the p-type MOS and that these defectives may not be remedied by a low-temperature process to be executed in the following annealing treatment. Namely, this Si ion implantation step is performed for the purpose of facilitating the recovery of crystal.

Since the Si crystal is forcedly destroyed of the order of atoms by the injecting energy on Si implantation so as to amorphize the Si crystal in this Si implantation method, this method is called "PAI: Pre-amorphization Implants". The PAI conditions on this occasion are: $Si^+$, 35 keV and $2 \times 10^{15}/cm^{-2}$. Subsequently, by means of photolithography, a resist pattern (not shown) is formed for the subsequent n- and p-type impurity implantations at low concentrations and then, by making use of the gate electrode 18 and the resist pattern (not shown) as a mask, n- and p-type impurities of low concentrations 19 are injected to the amorphized semiconductor thin film 16 through the through oxide film (residual film left after the etching of the gate oxide film) 20. When it is desired to make the polycrystalline silicon TFT into an n-channel type, phosphorus is ion-implanted (doping) to the semiconductor thin film 16. When it is desired to make the polycrystalline silicon TFT into a p-channel type, boron is ion-implanted (doping) to the semiconductor thin film 16 through the through oxide film (residual film left after the etching of the gate oxide film) 20. The ion implantation to one of the n-channel polycrystalline silicon TFT and the p-channel polycrystalline silicon TFT is performed by covering the semiconductor thin film 16 of the other polycrystalline silicon TFT by making use of a mask (not shown) such as a resist mask for preventing the undesirable ion implantation. Subsequently, the resist pattern (not shown) for implanting an n-type or a p-type impurity at a low concentration is removed and a new resist pattern (not shown) for implanting a remaining one of the n-type impurity and the p-type impurity at a low concentration is formed by means of photolithography. Then, by making use of the gate electrode 18 and the resist pattern (not shown) as a mask, an impurity 19 of low concentrations is injected to the amorphized semiconductor thin film 16.

Incidentally, there is no limitation with regard to the order of implanting the n-type impurity and the p-type impurity of low concentrations. Namely, the n-type impurity may be implanted prior to the p-type impurity and vice versa. With respect to the conditions for the ion implantation to each of the n-channel polycrystalline silicon TFT and the p-channel polycrystalline silicon TFT, they may be $^{31}P^+$, 50 keV and $5 \times 10^{13}/cm^{-2}$ for the n-channel polycrystalline silicon TFT and $^{49}BF_2^+$, 50 keV and $5 \times 10^{13}/cm^{-2}$ for the p-channel polycrystalline silicon TFT. After finishing the ion implantation to the p-channel polycrystalline silicon TFT, the resist pattern (not shown) is removed. Incidentally, the low concentration impurity implantation step to the p-channel polycrystalline silicon TFT may be sometimes omitted in view of the target performance of device or of the circumstances of related processes, or in view of the simplification of process.

FIG. 1J illustrates a state where an impurity is implanted at a low concentration, indicating the formation of a low concentration impurity layer 21 in the semiconductor pattern 16.

Subsequently, as shown in FIG. 1K, the protective layer {the through oxide film (residual film left after the etching of the gate oxide film) 20} is removed. This protective layer is employed for preventing the implantation of undesirable impurity on implanting an impurity of low concentrations.

Then, as shown in FIG. 1L, by making use of a plasma CVD method, an etching stopper oxide film 22 is formed as the first layer of the sidewall spacer of 3-ply structure. With respect to the conditions on this occasion, $SiH_4$ gas and $O_2$ gas may be employed as reaction gases and the temperature for forming the film 22 may be set to 350° C. One of the important roles of this oxide film 22 is the role as a through oxide film to be served on implanting a low concentration impurity. This oxide film 22 serves also as an etching stopper film on subsequently removing the etching stopper nitride film by means of dry etching.

Then, as shown in FIG. 1M, by making use of a plasma CVD method, an etching stopper nitride film 23 is formed as the second layer of the sidewall spacer of 3-ply structure. With respect to the conditions on this occasion, $SiH_4$ gas and $NH_3$ gas may be employed as reaction gases and the temperature for forming the film 23 may be set to 350° C. This etching stopper nitride film 23 plays a role of an etching stopper film on subsequently forming the sidewall spacer. As for the nitride film, it is possible to employ an oxynitride film.

Subsequently, as shown in FIG. 1N, by making use of a film-forming method such as a plasma CVD method, an oxide film 24 occupying a major portion of the sidewall spacer (a sacrificial film $SiO_2$ for the sidewall spacer) is formed. With respect to the conditions on this occasion, $SiH_4$ gas and $O_2$ gas may be employed as reaction gases and the temperature for forming the film 24 may be set to 350° C. The process of forming the films shown in FIGS. 1L-1N can be continuously performed by transferring a specimen from one chamber to another chamber which are disposed within the same vacuum apparatus without necessitating the release of vacuum.

In the step shown in FIG. 1O, the dry etching of the oxide film 24 is performed for forming the sidewall spacer. In this case, the oxide film 24 is uniformly etch-backed so as to reduce the thickness of the oxide film 24 by a thickness corresponding to the thickness thereof. However, since non-uniformity of ±10% is generally caused to occur in the ordinary etching, a variability of ±50 nm will be caused to occur as the etch-back is performed to a depth of 500 nm. If this variability is transcribed to an underlying film, it would be needless to say that the film can no longer play the role of the through oxide film. If a nitride film can be employed as an etching stopper film, it becomes possible to attain a large $SiO_2/SiN$ selectivity ratio in the aforementioned etch-back process, thereby making it possible to absorb the aforementioned variability of etching. With respect to the conditions for the dry etching on this occasion, they can be attained by executing a directional dry etching such as an reactive ion etching (RIE) system using $CHF_3$ gas as an etching gas.

FIG. 1P illustrates a state wherein a sidewall oxide film 26 is formed.

Then, as shown in FIG. 1Q, exposed portions of the etching stopper nitride film 23 are removed.

As a result of the above-described procedures, it is possible to create a sidewall spacer of 3-ply structure consisting of the sidewall oxide film 26/the nitride film 23/the oxide film 22. By the way, the etching stopper oxide film 22 constituting the lowermost layer of the 3-ply sidewall spacer can be used, as it is, as a through oxide film on implanting an ion in the next step. To secure a desired sidewall width "W" in the creation of the sidewall spacer in this example, the film thickness of each of the etching stopper oxide film 22, the etching stopper nitride film 23 and the sidewall oxide film 26 is suitably adjusted. In this example, the sidewall width "W" was set to 0.2 μm through the adjustment of the film thickness of aforementioned 3-ply film.

In the step shown in FIG. 1R, first of all, a resist pattern (not shown) for implanting an n-type or p-type impurity at a high concentration is formed by means of photolithography. Then, by making use of the gate electrode 18 bearing the 3-ply sidewall film and a resist pattern (not shown) as a mask, a high concentration of an n-type or p-type impurity 27 is injected to the semiconductor thin film 16. When it is desired to make the polycrystalline silicon TFT into an n-channel type, phosphorus is ion-implanted (doping) to the semiconductor thin film 16. When it is desired to make the polycrystalline silicon TFT into a p-channel type, boron is ion-implanted (doping) to the semiconductor thin film 16. On this occasion, the ion implantation to one of the n-channel polycrystalline silicon TFT and the p-channel polycrystalline silicon TFT is performed by covering the semiconductor thin film 16 of the other polycrystalline silicon TFT by making use of a mask (not shown) such as a resist mask for preventing the undesirable ion implantation.

Subsequently, the resist pattern (not shown) for implanting an n-type or a p-type impurity at a high concentration is removed and a new resist pattern (not shown) for implanting a remaining one of the n-type impurity and the p-type impurity at a high concentration is formed by means of photolithography. Then, by making use of the gate electrode 18 provided with the 3-ply sidewall film and the resist pattern (not shown) as a mask, an impurity 27 of high concentrations is injected to the semiconductor thin film 16.

FIG. 1R shows a state indicating the injection of an impurity 27 of high concentrations, thereby creating a high-concentration impurity layer 28. Incidentally, there is no limitation with regard to the order of implanting the n-type impurity and the p-type impurity of high concentrations. Namely, the n-type impurity may be implanted prior to the p-type impurity and vice versa. With respect to the conditions for the ion implantation to each of the n-channel polycrystalline silicon TFT and the p-channel polycrystalline silicon TFT, they may be $^{31}P^+$, 35 keV and $2\times10^{15}/cm^{-2}$ for the n-channel polycrystalline silicon TFT and $^{49}BF_2^+$, 35 keV and $2\times10^{15}/cm^{-2}$ for the p-channel polycrystalline silicon TFT. After finishing the ion implantation to the p-channel or the n-channel polycrystalline silicon TFT, the resist pattern (not shown) is removed.

Then, as shown in FIG. 1S, the etching stopper oxide film 22 that has been used as a through oxide film on implanting ions is removed to expose the source region 29 and the drain region 30.

Then, as shown in FIG. 1T, as a preceding step for forming a layer of a compound constituted by a high-melting-point metal and a semiconductor, i.e. a high-melting-point metal silicide layer, a high-melting-point metal thin film 31 is deposited according to the conventional method. This high-melting-point metal thin film 31 can be generally formed according to a DC magnetron sputtering system after the chamber is evacuated to a level of high vacuum. In this example, a high-melting-point metal film having a thickness of 50 nm was employed by adjusting the RF power and the degree of vacuum. The high-melting-point metal thin film 31 thus formed was formed of a polycrystalline layer exhibiting a strong orientation of (111). Although it was possible to variously modify this crystalline state in terms of the crystal gain diameter, the granular structure and columnar structure by variously selecting the film-forming conditions, they were anyways formed of polycrystal.

Incidentally, the high-melting-point metal may be one kind of metal selected from the group consisting of Ni, Ti, Co, Mo and W.

Subsequently, in the step shown in FIG. 1U, lamp-annealing light 32 is irradiated, as a siliciding heat treatment, all over the surface of the high-melting-point metal thin film 31, thereby executing the heat treatment. Due to this heat treatment 32, the high-melting-point metal thin film 31 is enabled to react with the source region 29 and the drain region 30, thereby forming a high-melting-point metal silicide 33 of metastable state at the interface thereof. In this case, laser annealing, flash lamp annealing, halogen lamp annealing or heat treatment furnace may be employed as this heat treatment. These means may be selected according to the design rule of device. In this example, the heat treatment was performed by making use of an RTA (Rapid Thermal Annealing) apparatus using a tungsten halogen lamp and at a temperature of not higher than 500° C.

In the step shown in FIG. 1V, a selective etching is performed. Namely, the resultant structure thus heat-treated is dipped in a solution which is capable of dissolving unreacted high-melting-point metal material but incapable of dissolving the high-melting-point metal silicide material, thereby enabling the high-melting-point metal silicide 33 of metastable state to remain only on the source region 29 and on the drain region 30 in a self-aligned manner. In this selective etching treatment, an aqueous solution of $H_2SO_4+H_2O_2$ or an aqueous solution of $NH_4OH+H_2O_2$ for example can be employed as an etchant.

Then, in the step shown in FIG. 1W, to turn the high-melting-point metal silicide 33 of metastable state into a stable high-melting-point metal silicide 35, lamp-annealing light 34 is again irradiated all over the surface of the high-melting-point metal silicide 33, thereby executing the heat treatment 34.

Subsequently, as shown in FIG. 1X, an interlayer insulating film 36 is deposited on the gate electrode 18, the source region 29 and the drain region 30. This interlayer insulating film 36 is formed of a silicon oxide film having a thickness of 500 nm and deposited, by means of plasma CVD for example, on the surfaces of the gate electrode 18, the source region 29 and the drain region 30. This plasma CVD can be performed at a substrate temperature of 350° C.

Then, as shown in FIG. 1Y, a resist pattern is formed at first by means of photolithography and then openings are formed in the interlayer insulating film 36 by way of dry etching treatment using the aforementioned resist pattern as a mask, thereby partially exposing the gate electrode 18, the source region 29 and the drain region 30 and creating contact holes 37 and 38. In this dry etching, $CHF_3$ for example can be employed as an etching gas. FIG. 1Y illustrates a state where the resist pattern is removed from the interlayer insulating film 36. The resist pattern can be removed under the conditions of: a 20-minutes ashing treatment using $O_2$ plasma and a dipping treatment using an organic stripping solution.

Then, in the step shown in FIG. 1Z, at first, metallic electrode films 39 and 40 are deposited inside the contact holes 37 and 38 and on the surface of the interlayer insulating film 36. The metallic electrode films 39 and 40 are respectively formed of a laminate film consisting of a 400-nm-thick aluminum and 100-nm-thick Ti, which are formed by means of DC sputtering for instance. The sputtering conditions for these metallic electrode films may be: 100° C. in substrate temperature, 4 mTorr in Ar pressure, and 2 kW in RF power in the case of the Ti film having a thickness of 100 nm; and 100° C. in substrate temperature, 4 mTorr in Ar pressure, and 10 kW in RF power in the case of the Al film.

Then, a resist material is coated on the surface of the metallic electrode film and then selectively irradiated by making use of a photomask. All of the resist material excluding portions thereof deposited on the masked source electrode region and on the masked drain electrode region is removed to form a resist pattern. Subsequently, by way of dry etching treatment using this resist pattern as a mask, the metallic electrode film is patterned to form the source electrode 39 and the drain electrode 40. In this dry etching treatment, $BCl_3$ and $Cl_2$ for example may be used as an etching gas and the laminate film consisting of aluminum and Ti can be collectively etched under the conditions of: 30 SCCM in flow rate of $BCl_3$ and 20 SCCM in flow rate of $Cl_2$, 15 mTorr in pressure and 30 W in RF power. Subsequently, the resist pattern is removed from the source electrode 39 and the drain electrode 40.

By going through the aforementioned steps, the manufacture of the polycrystalline silicon TFT can be accomplished.

Example 2

In Example 1, there has been explained a process for manufacturing a TFT of LDD structure having a high-melting-point metal silicide film formed on the surface of the source/drain regions and provided with a 3-ply sidewall. In this example however, one example of a TFT of LDD structure provided with a 3-ply sidewall but dispensed with the steps of forming the high-melting-point metal silicide film will be explained.

Figure 2:
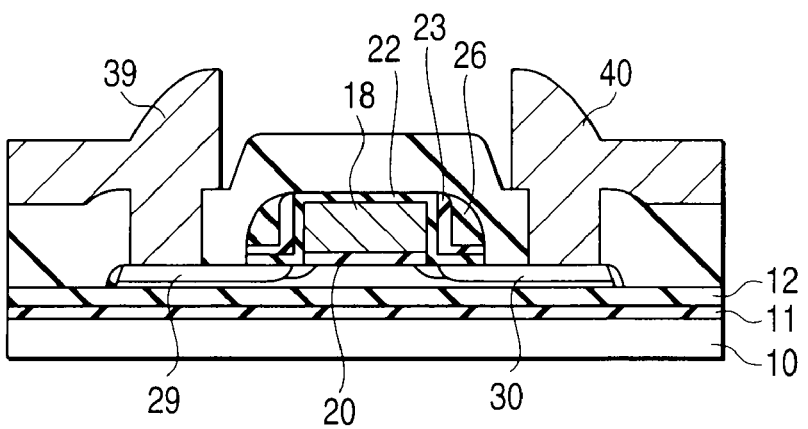
FIG. 2 is a cross-sectional view of a polycrystalline silicon thin-film transistor according to Example 2.

Namely, the steps shown in FIGS. 1T-1W are omitted from the steps shown in Example 1. Therefore, the structure shown in FIG. 1S is directly subjected to the treatment of the step shown in FIG. 1X. In the same manner described in Example 1, the formation of the interlayer insulating film 36 (FIG. 1X), the formation of the contact holes 37 and 38 (FIG. 1Y) and the formation of the source electrode 39 and the drain electrode 40 are executed to accomplish the manufacture of the TFT of LDD structure as shown in FIG. 2.

Example 3

In this Example 3, there is suggested one example of a TFT having a stacked source/drain LDD structure, which is provided with a 3-ply sidewall and configured to have a polycrystalline silicon layer containing an impurity and formed on the surface of the source/drain regions.

Namely, as shown in FIG. 1S, after a sidewall spacer has been formed on the sidewall of the gate electrode, an amorphous silicon layer for forming a stacked source and drain layers is formed on the surface of the resultant structure. Then, by making use of the gate electrode and the sidewall spacer as a mask, an impurity of high concentrations is implanted in the semiconductor thin film and the amorphous silicon layer, thereby creating a source diffusion portion and a drain diffusion portion in the semiconductor thin film. The resultant structure is then heat-treated to activate the impurities introduced into the semiconductor thin film and the amorphous silicon layer and also to restore the crystal of only the amorphous silicon layer deposited on the semiconductor thin film, thereby forming a polycrystalline silicon layer. Then, the resultant structure is subjected to selective etching, thereby leaving only the polycrystalline silicon layer deposited on the semiconductor thin film and removing the amorphous silicon layer deposited on other regions. As a result, a stacked source diffusion layer 41 which is made of polycrystalline silicon is enabled to be formed on the source region 29 and a stacked drain diffusion layer 42 which is made of polycrystalline silicon is enabled to be formed on the drain region, whereby both of the stacked source diffusion layer 41 and the stacked drain diffusion layer 42 are enabled to be formed in a self-aligned manner.

Subsequently, the source electrode 39 and the drain electrode 40 are formed to obtain a TFT having a stacked source/drain LDD structure as shown in FIG. 3.

Example 4

In this Example, there is suggested one example of a TFT having an LDD structure, which is provided with a 3-ply sidewall and configured to have a stacked source/drain diffusion layer on the surface of the source/drain regions and a high-melting-point metal silicide film on the surface of the stacked source/drain diffusion layers.

Namely, as shown in FIG. 1S, after a sidewall spacer has been formed on the sidewall of the gate electrode, an amorphous silicon layer for forming a stacked source and drain layers is formed on the surface of the resultant structure. Then, by making use of the gate electrode and the sidewall spacer as a mask, an impurity of high concentrations is implanted in the semiconductor thin film and the amorphous silicon layer, thereby creating a source diffusion portion and a drain diffusion portion in the semiconductor thin film. The resultant structure is heat-treated to activate the impurities introduced into the semiconductor thin film and the amorphous silicon layer and also to restore the crystal of only the amorphous silicon layer deposited on the semiconductor thin film, thereby forming a polycrystalline silicon layer. Then, the resultant structure is subjected to selective etching, thereby leaving only the polycrystalline silicon layer deposited on the semiconductor thin film and removing the amorphous silicon layer deposited on other regions. As a result, a stacked source diffusion layer 41 which is made of polycrystalline silicon is enabled to be formed on the source region 29 and a stacked drain diffusion layer 42 which is made of polycrystalline silicon is enabled to be formed on the drain region, whereby both of the stacked source diffusion layer 41 and the stacked drain diffusion layer 42 are enabled to be formed in a self-aligned manner.

Then, in the same manner as described in Example 1, the resultant structure is subjected to the same steps as those described in FIGS. 1T-1Z to obtain a TFT having an LDD structure having silicide films 43 and 44 formed additionally on the stacked source/drain diffusion layers as shown in FIG. 4.

Example 5

In this Example, there is suggested one example of a TFT having an LDD structure, which is provided with a 3-ply sidewall and configured to have a convex source/drain structure wherein polycrystalline silicon containing an impurity is buried in the contact holes formed in the interlayer insulating film which is deposited on the source/drain diffusion regions.

Namely, the steps shown in FIGS. 1T-1W are omitted from the steps shown in Example 1. Therefore, the structure shown in FIG. 1S is directly subjected to the treatment of the step shown in FIG. 1X, thereby forming the interlayer insulating film 36. Then, as shown in FIG. 1Y, contact holes 37 and 38 are formed. Thereafter, amorphous silicon is deposited on the interlayer insulating film so as to fill the contact holes 37 and 38 with the amorphous silicon. Then, an impurity is injected into the amorphous silicon layer and the resultant amorphous silicon layer is subjected to a first heat treatment, thereby activating the impurity existing in the amorphous semiconductor layer and, at the same time, enabling the amorphous semiconductor which is buried in the contact holes connected with the source region 29 and the drain region 30 to crystallize into polycrystalline silicon. Then, the resultant structure is subjected to selective etching, thereby removing the amorphous silicon layer and leaving only the polycrystalline silicon layer in the contact holes. Therefore, it is possible to create, in a self-aligned manner, a convex source diffusion layer 45 made of polycrystalline silicon and buried in the contact hole 37 as well as a convex drain diffusion layer 46 made of polycrystalline silicon and buried in the contact hole 38.

Subsequently, the source electrode 39 and the drain electrode 40 are formed to obtain a TFT having an LDD structure which is provided with a 3-ply sidewall and with a convex source/drain structure as shown in FIG. 5.

Example 6

In this Example, there is suggested one example of a TFT having an LDD structure, which is provided with a 3-ply sidewall and configured to have a convex source/drain structure wherein a silicide layer is formed on the surface of the convex source/drain regions.

Namely, after a convex source diffusion layer 45 made of polycrystalline silicon has been buried in the contact hole 37 in a self-aligned manner and a convex drain diffusion layer 46 made of polycrystalline silicon has been buried in the contact hole 38 in a self-aligned manner, a high-melting-point metal thin film is deposited. Then, lamp-annealing light, for example, is irradiated all over the surface of the high-melting-point metal thin film, thereby enabling the high-melting-point metal to react with the polycrystalline silicon to form a high-melting-point metal silicide.

Figure 6:
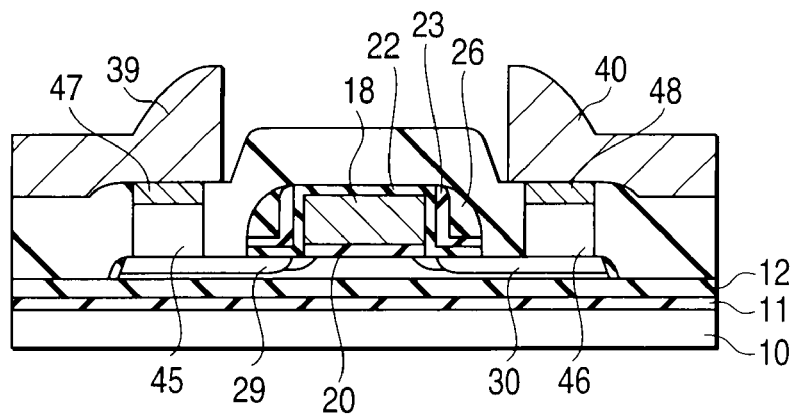
FIG. 6 is a cross-sectional view of a polycrystalline silicon thin-film transistor according to Example 6.

Then, after finishing the dissolution of the unreacted high-melting-point metal, the source electrode 39 and the drain electrode 40 are formed to obtain a TFT having an LDD structure, which is provided with a 3-ply sidewall and configured to have a convex source/drain structure wherein silicide layers 47 and 48 are formed on the surface of the convex source/drain regions as shown in FIG. 6.

Example 7

In this Example, there is suggested one example of a flat TFT having an LDD structure which is provided with a 3-ply sidewall.

Namely, after the semiconductor pattern 16 has been formed as shown in FIG. 1F according to Example 1, the step portions between the semiconductor pattern 16 and the peripheries thereof is buried with an insulating film 49 to form a first flat structure having a height of surface step portions confined to 0.1 μm or less. Then, after a source region and a drain region have been formed, the surface step portions generated by the gate electrode having a 3-ply sidewall on the sidewall thereof are buried with an interlayer insulating film 50, thereby forming a second flat structure having a height of surface step portions confined to 0.1 μm or less. Then, the contact holes formed in the interlayer insulating film is filled with contact plugs 51 and 52, thereby forming a third flat structure having a height of surface step portions confined to 0.1 μm or less. Thereafter, a source electrode 54 and a drain electrode 55 buried in an insulating film 53 and connected, via the contact plugs, with the source region and the drain region, respectively, are formed on the third flat structure, thereby forming a fourth flat structure having a height of surface step portions confined to 0.1 μm or less.

Figure 7:
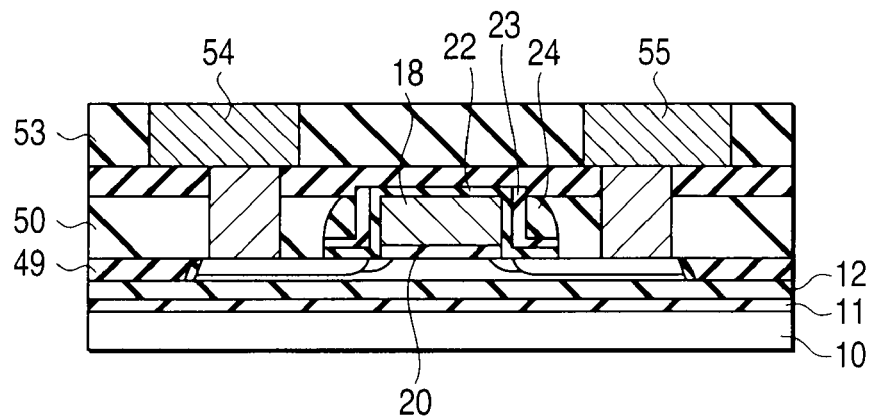
FIG. 7 is a cross-sectional view of a polycrystalline silicon thin-film transistor according to Example 7.

As a result, a flat TFT having an LDD structure which is provided with a 3-ply sidewall as shown in FIG. 7 can be obtained.

Example 8

In this Example, there is suggested one example of a TFT having an LDD structure which is provided with a 3-ply sidewall and with contact plugs formed of a high-melting-point metal silicide.

Figure 8:
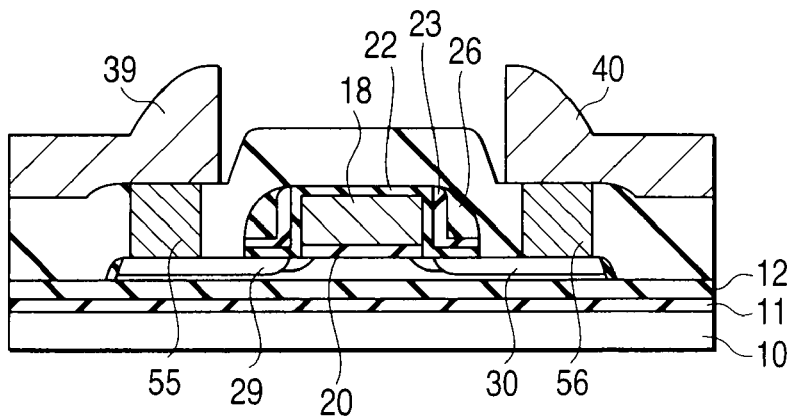
FIG. 8 is a cross-sectional view of a polycrystalline silicon thin-film transistor according to Example 8.

Namely, after polycrystalline silicon containing an impurity has been buried in the contact holes formed in the interlayer insulating film which is located on the source/drain regions 29 and 30 according to Example 6, a high-melting-point metal ion is implanted in the polycrystalline silicon. Then, the resultant structure is heat-treated to enable the implanted high-melting-point metal ion to react with the Si of the polycrystalline silicon layer, thereby creating a high-melting-point metal silicide layer. Thereafter, the source electrode 39 and the drain electrode 40 are formed according to the ordinary method to obtain a TFT having an LDD structure which is provided with a 3-ply sidewall and with contact plugs 55 and 56 formed of a high-melting-point metal silicide as shown in FIG. 8.

Next, one example wherein the polycrystalline silicon TFT obtained in the above-described example is actually applied to an active matrix liquid crystal display device will be explained.

Figure 9:
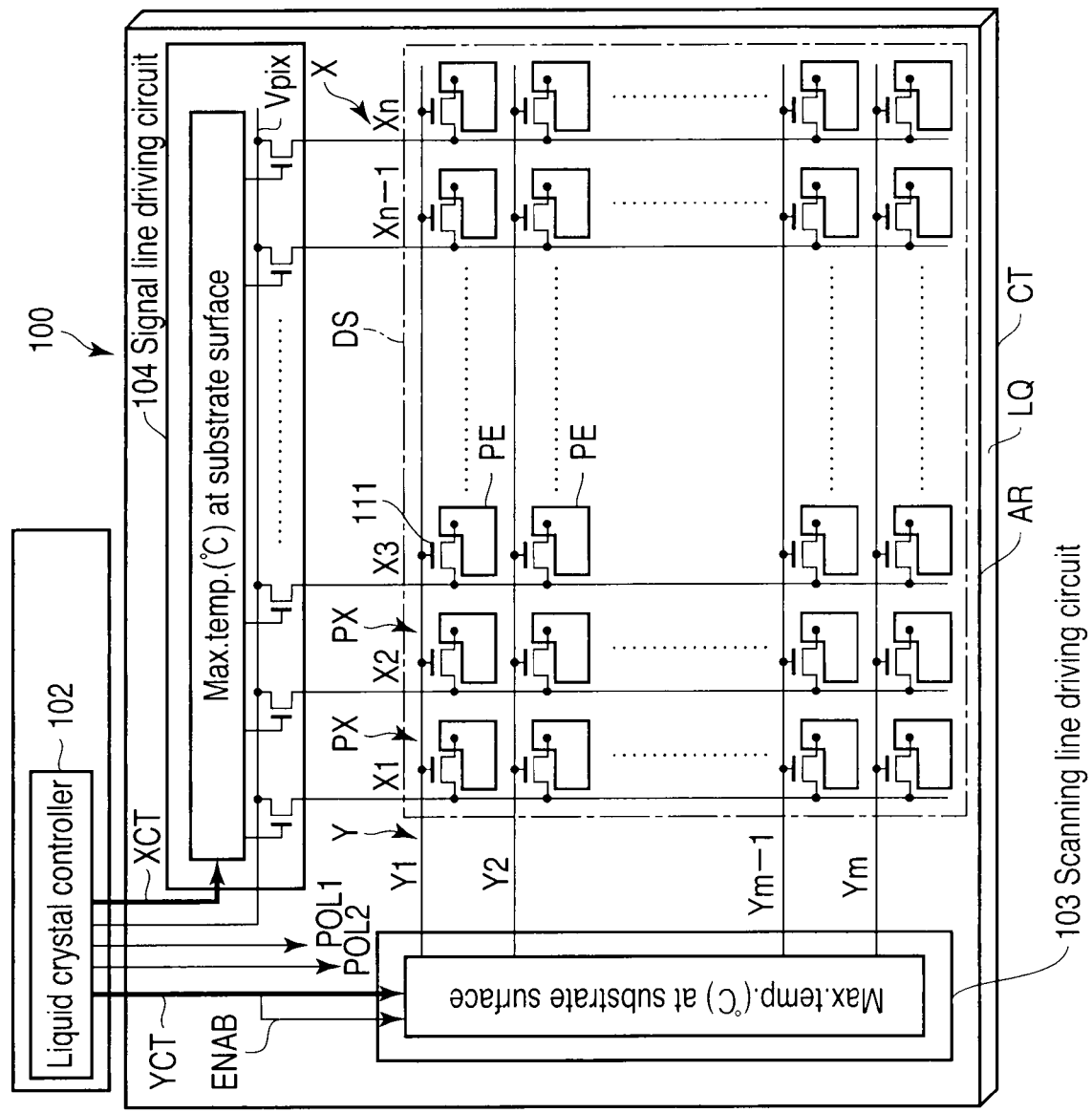
FIG. 9 is a diagram schematically illustrating the circuit structure of an active matrix liquid crystal display device wherein the thin-film transistors obtained in Examples 1-8 were employed.
Figure 10:
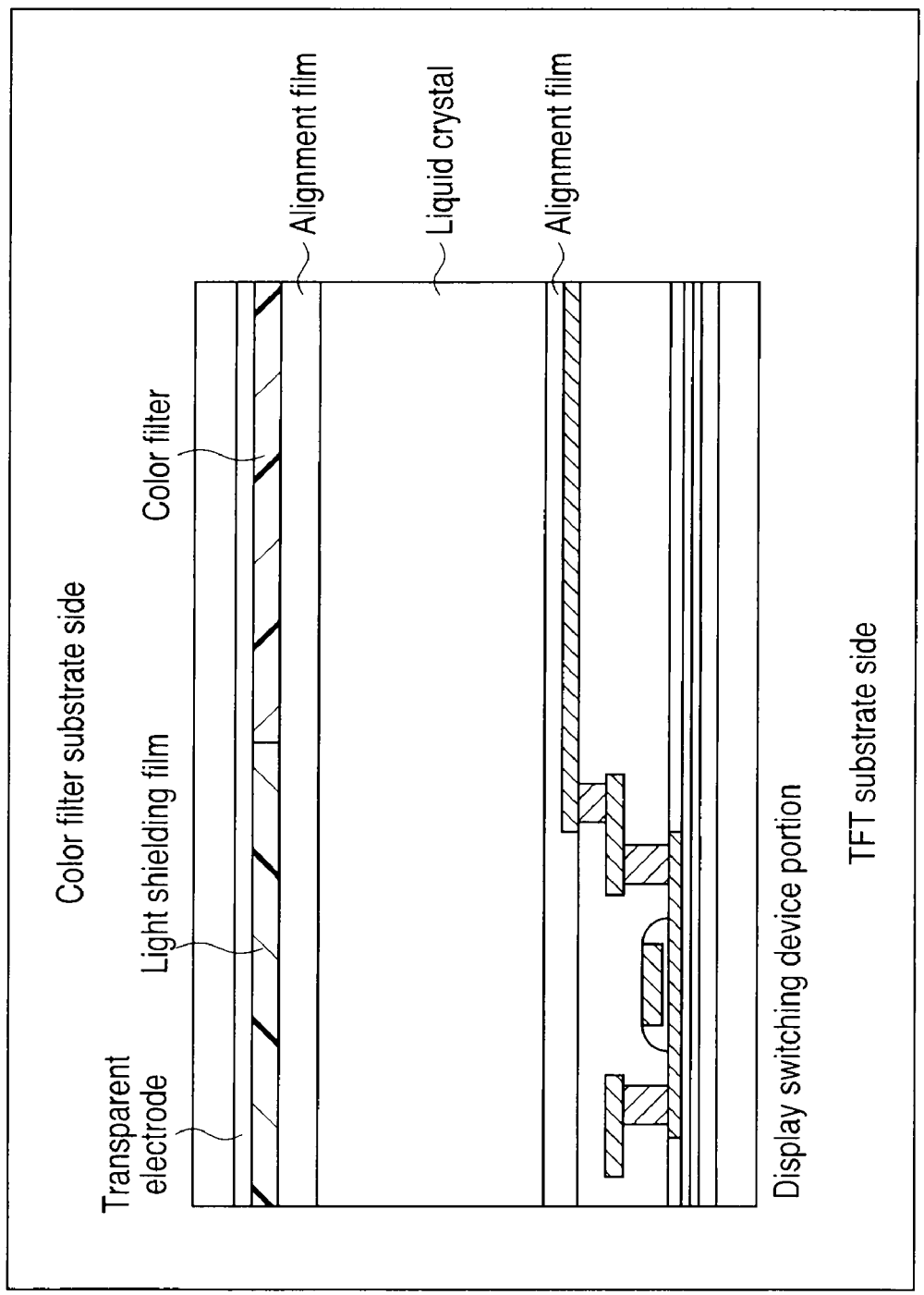
FIG. 10 is a cross-sectional view schematically illustrating the cross-sectional structure of a liquid crystal display device.
Figure 11:
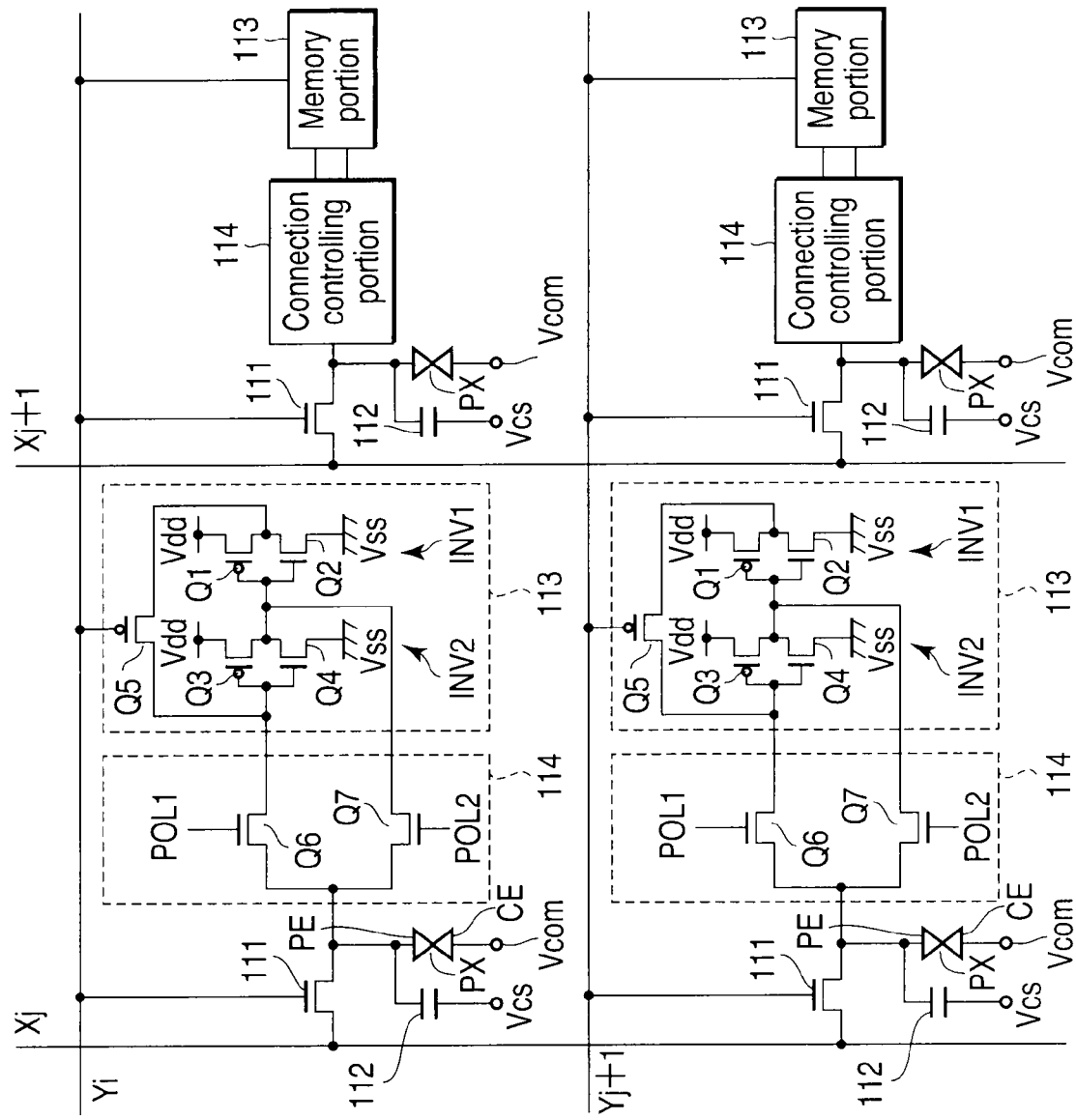
FIG. 11 is a diagram illustrating an equivalent circuit of the periphery of the display pixel shown in FIG. 10.

FIG. 9 shows a schematic circuit structure of the liquid crystal display device manufactured by making use of the aforementioned TFT. FIG. 10 shows a schematic cross-sectional view of this liquid crystal display device. FIG. 11 shows an equivalent circuit of the periphery of the display pixel.

This liquid crystal display device is equipped with a liquid crystal display panel 100 and with a liquid crystal controller 102 for controlling the liquid crystal display panel 100. This liquid crystal display panel 100 is configured such that the liquid crystal layer LQ thereof is sustained between an array substrate AR and a counter substrate CT. The liquid crystal controller 102 is disposed on a driving circuit substrate which is disposed independent from the liquid crystal display panel 100.

The array substrate AR is equipped with a plurality of pixel electrodes PE which are arranged in a form of matrix in the display region DS on a glass substrate; with a plurality of scanning lines (Y1-Ym) which are formed along the lines of the plurality of pixel electrodes PE; with a plurality of signal lines (X1-Xn) which are formed along the columns of the plurality of pixel electrodes PE; pixel switching elements 111 respectively disposed close to each of the intersected portions between the signal lines X1-Xn and the scanning lines Y1-Ym and designed to take up picture signals Vpix from corresponding signal line X in response to the scanning signals transmitted from each of corresponding scanning lines Y and to transmit these signals to a corresponding pixel electrode PE; a scanning line driving circuit 103 for driving the scanning lines Y1-Ym; and a signal line driving circuit 104 for driving the signal lines X1-Xn. Each of the pixel switching elements 111 may be constituted, for example, by a N-channel polycrystalline silicon thin-film transistor that can be manufactured as described in the above-described examples. In the same manner as in the case of the thin-film transistor of the pixel switching elements 111, the scanning line driving circuit 103 and the signal line driving circuit 104 may be integrally constructed by a plurality of polycrystalline silicon thin-film transistors which are designed to be formed on the array substrate AR as described in the above-described examples. The counter substrate CT is disposed to face a plurality of the pixel electrodes PE and comprises a single counter electrode CE to be set to a common potential Vcom and a color filter (not shown).

The liquid crystal controller 102 is designed to receive picture signals and synchronizing signals to be supplied from an external device for example and to generate, at an ordinary display mode, pixel picture signals Vpix, vertical scanning control signals YCT and horizontal scanning control signals XCT. The vertical scanning control signals YCT include, for example, a vertical start pulse, a vertical clock signal, an output enable signal ENAB, etc. which are designed to be supplied to the scanning line driving circuit 103. The horizontal scanning control signals XCT include, for example, a horizontal start pulse, a horizontal clock signal, a polarity inversion signal, etc. which are designed to be supplied to the signal line driving circuit 104 together with the picture signals Vpix.

The scanning line driving circuit 103 includes a shift resistor and is designed to be controlled by the vertical scanning control signals YCT so as to successively supply scanning signals for conducting the pixel switching elements 111 to the scanning lines Y1-Ym at each vertical scanning (frame) period. The shift resistor is designed to shift, synchronously with the vertical clock signal, the vertical start pulse to be supplied at each vertical scanning period, thereby enabling to select one scanning line from a plurality of the scanning lines Y1-Ym and to output a scanning signal to the selected scanning line in reference to the output enable signal ENAB. To enable the output of scanning signal during the effective scanning period out of the vertical scanning (frame) period, the output enable signal ENAB is maintained at a high level and, at the same time, to disable the output of scanning signal during the vertical blanking period excluding the effective scanning period from the vertical scanning period, the output enable signal ENAB is maintained at a low level.

The signal line driving circuit 104 comprises a shift resistor and a sampling output circuit and is enabled to execute the series-parallel conversion of the picture signal to be input during one horizontal scanning period (1H) wherein each of the scanning lines Y is driven by the scanning signal and hence the signal line driving circuit 104 is designed to be controlled by the horizontal scanning control signal XCT so as to feed the analog picture signal Vpix that has been sampled as a pixel display signal to each of the signal lines X1-Xn.

Incidentally, the counter electrode CE is set to a common potential Vcom as shown in FIG. 9. This common potential Vcom is designed to be inverted in level from 0 to 5 V or from 5 to 0 V every horizontal scanning period (H) in the ordinary display mode and also designed to be inverted in level from 0 to 5 V or from 5 to 0 V every frame period (F) in the stationary display mode. Further, in the ordinary display mode, the common potential Vcom may be inverted in level every 2H or every frame period (F), for example, instead of executing the level inversion of the common potential Vcom every horizontal scanning period (H) as described in this embodiment.

The polarity inversion signal is fed, synchronously with the level inversion of this common potential Vcom, to the signal line driving circuit 104. In this signal line driving circuit 104, the picture signal Vpix having an amplitude width ranging from 0 to 5 V in the ordinary display mode is output after executing the level inversion in response to the polarity inversion signal so as to take the opposite polarity to the common potential Vcom in the ordinary display mode, whereas in the stationary mode, a picture signal restricted in gradation for a stationary picture is output and then the operation thereof is suspended.

The liquid crystal layer LQ of this liquid crystal display panel 100 is formed of normally white capable of executing a black display through the application of a picture signal Vpix of 5 V, for example, to the pixel electrode PE relative to a common potential Vcom of 0 V which is set to the counter electrode CE. In this case, an H-common reversion driving is adopted wherein, as described above, the potential relationship between the picture signal Vpix and the common potential Vcom is alternately reversed every horizontal scanning period (H) in the ordinary display mode, and a frame reversion driving is adopted wherein the potential relationship is alternately reversed every frame in the stationary display mode.

Display face is constituted by a plurality of display pixels PX. Each of the display pixels PX comprises a pixel electrode PE, a counter electrode CE and a liquid crystal material of the liquid crystal layer LQ which is sandwiched between the PE and the CE. Further, a plurality of static memory portions 113 and a plurality of connection control portions 114 are respectively arranged relative to the plurality of the display pixels PX.

As shown in FIG. 9, the pixel electrode PE are connected to the pixel switching elements 111 which is designed to selectively pick up the picture signal Vpix on the signal lines X and are also capacitively coupled to the auxiliary capacity lines having an electric potential Vcs which is set equal to the common potential Vcom of the counter electrode CE. The pixel electrode PE and the counter electrode CE are designed to constitute a liquid crystal capacity through a liquid crystal material, whereas the pixel electrode PE and the auxiliary capacity lines are designed to constitute, without the intervention of the liquid crystal material, an auxiliary capacity 112 which is parallel with the liquid crystal capacity.

The pixel switching elements 111 are designed to transmit the picture signal Vpix on the signal lines X to the display pixels PX as the pixel switching elements 111 are driven by a scanning signal transmitted from the scanning lines Y. The auxiliary capacity 112 is provided with a sufficiently large capacity value as compared with the liquid crystal capacity and is designed to execute the charging/discharging by way of the picture signal Vpix which has been transmitted to the display pixels PX. When the picture signal Vpix is retained in the auxiliary capacity 112 by this charging/discharging, this picture signal Vpix acts to compensate the fluctuation of electric potential that is kept in the liquid crystal capacity as the pixel switching elements 111 are turned into non-conductive, thereby making it possible to retain the potential difference between the pixel electrode PE and the counter electrode CE.

Further, each of the static memory portions 113 is provide with P-channel polycrystalline silicon thin-film transistors Q1, Q3 and Q5 and N-channel polycrystalline silicon thin-film transistors Q2 and Q4, which can be created as described in the aforementioned examples, and hence each of the static memory portions 113 is designed to keep the picture signal Vpix that has been transmitted to the display pixels PX from the pixel switching elements 111. Each of the connection control portions 114 is provide with N-channel polycrystalline silicon thin-film transistors Q6 and Q7 and is designed not only to control the electric connection between the display pixels PX and the static memory portions 113 but also to constitute a polarity control circuit for controlling the output polarity of the picture signal kept in the static memory portions 113.

The thin-film transistors Q1 and Q2 are configured so as to constitute a first inverter circuit INV1 which can be actuated by the power source voltage between a power source terminal Vdd (=5 V) and a power source terminal Vss (=0 V), whereas the thin-film transistors Q3 and Q4 are configured so as to constitute a second inverter circuit INV2 which can be actuated by the power source voltage between the power source terminals Vdd and Vss. The output terminal of the first inverter circuit INV1 is connected, via the thin-film transistors Q5 which can be controlled by way of the scanning lines Y, with the input terminal of the second inverter circuit INV2. The output terminal of the second inverter circuit INV2 is connected with the input terminal of the first inverter circuit INV1. The thin-film transistors Q5 is designed such that it becomes non-conductive during a frame period wherein the pixel switching elements 111 are made conductive due to the rise of scanning signal from the scanning lines Y and that it becomes conductive during the next frame period. Because of this, the thin-film transistors Q5 can be maintained in a non-conductive state until the pixel switching elements 111 is at least enabled to pick up the picture signal Vpix.

In the stationary mode, the thin-film transistors Q1 and Q2 will be controlled by the polarity control signals POL1 and POL2 which will be alternately set to a high level every frame period. The thin-film transistor Q6 is connected with an intermediate portion between the pixel electrode PE and the output terminal of the first inverter circuit INV1 through the input terminal of the second inverter circuit INV2 and the thin-film transistor Q5. The thin-film transistor Q7 is connected with an intermediate portion between the pixel electrode PE and the input terminal of the first inverter circuit INV1 and also connected with an intermediate portion between the pixel electrode PE and the output terminal of the second inverter circuit INV2.

This liquid crystal display device is formed of a driving circuit-integrated body wherein the scanning line driving circuit 103, the signal line driving circuit 104, the static memory portions 113 and the connection control portions 114 are disposed on the same array substrate AR as that of the pixel switching elements 111. Herein, the scanning line driving circuit 103, the signal line driving circuit 104, the static memory portions 113 and the connection control portions 114 are collectively created according to the process explained in the aforementioned examples. Therefore, it is possible to improve not only the performance but also the productivity of the liquid crystal display device. Further, since the static memory portions 113 are installed, it is possible to secure the function of retaining the picture signals supplied to the display pixel PX. Since the picture signals can be fed from the static memory portions 113 to the display pixel PX in the stationary display mode, it is possible to suspend the scanning line driving circuit 103 and the signal line driving circuit 104 while keeping this state, thereby making it possible to save entirely the power consumption of the display device.

As described above, according to the present invention, it is possible to form a sidewall spacer which is excellent in working precision, capable of securing the stability of production even in the mass production, free from the generation of damage, and free from giving any adverse influence to the device. Therefore, it is now possible to provide a thin-film semiconductor device excellent in characteristics and to provide a method of manufacturing such a thin-film semiconductor device.

What is claimed is:

1. A thin-film semiconductor device comprising:
   a transparent insulating substrate;
   an island silicon layer formed on the transparent insulating substrate and including a source region containing a first-conductivity-type impurity and a drain region containing a first-conductivity-type impurity and spaced apart from the source region;
   a gate insulating film and a gate electrode which are formed on a portion of the island silicon layer, which is located between the source region and the drain region;
   a crystal-recovering layer formed in a surface of the source region and in a surface of the drain region;
   a sidewall spacer having a 3-ply structure including a first oxide film, a nitride film and a second oxide film, which are respectively formed on a sidewall of the gate electrode at a temperature of 500° C. or less;
   a stacked source polycrystalline silicon layer formed on the source region and containing the first-conductivity-type impurity and a stacked drain polycrystalline silicon layer formed on the drain region and containing the first-conductivity-type impurity, the stacked source polycrystalline silicon layer and the stacked drain polycrystalline silicon layer being formed by solid-state growth;
   high-melting-point metal silicide layers formed on the stacked source polycrystalline silicon layer and the stacked drain polycrystalline silicon layer, the high-melting-point metal being one selected from the group consisting of Ni, Ti, Mo, and W; and
   an interlayer insulating film covering the high-melting-point metal silicide layers and the gate electrode,
   wherein
   said source region and said drain region are formed using the sidewall spacer as a mask.

2. The device according to claim 1, wherein
   said stacked source polycrystalline silicon layer is a convex source polycrystalline silicon layer containing the first conductive impurity and buried in a first contact hole formed in the interlayer insulating film and connected with the source region, and said stacked drain polycrystalline silicon layer is a convex drain polycrystalline silicon layer containing the first conductive impurity and buried in a second contact hole formed in the interlayer insulating film and connected with the drain region.

3. The device according to claim 1, wherein a step between the island crystalline silicon layer and the peripheral region thereof is buried with a first insulating film to form a first flat structure with unevenness confined to 0.1 μm or less; a step generated by the gate electrode is buried with a second insulating film to form a second flat structure with unevenness confined to 0.1 μm or less; first and second contact holes formed in the second insulating film are filled with a contact plug made of a metallic material to form a third flat structure with unevenness confined to 0.1 μm or less; and the source electrode and the drain electrode are buried with the third insulating film to form a fourth flat structure with unevenness confined to 0.1 µm or less, and said source electrode and said drain electrode are connected respectively to the source region and the drain region via the contact plugs.

4. The device according to claim 1, wherein the sidewall spacer has a width of 0.2 µm.

5. The device according to claim 1, wherein sidewall spacers having the 3-ply structure are formed on opposing sidewalls of the gate electrode and the stacked source polycrystalline silicon layer and the stacked drain polycrystalline silicon layer are located horizontally adjacent to the sidewall spacers.

\* \* \* \* \*